United States Patent [19]

Robertson et al.

[11] 4,434,212

[45] Feb. 28, 1984

[54] DEVICE FOR PROPAGATING MAGNETIC DOMAINS

[75] Inventors: John M. Robertson; Dirk J. Breed; Antonius B. Voermans, all of Eindhoven, Netherlands

[73] Assignee: U.S. Philips Corporation, New York, N.Y.

[21] Appl. No.: 281,270

[22] Filed: Jul. 8, 1981

[30] Foreign Application Priority Data

Jul. 11, 1980 [NL] Netherlands ........................ 8004009

[51] Int. Cl.³ ........................ G11C 11/02; C04B 35/50

[52] U.S. Cl. ............................ 428/693; 156/DIG. 63; 252/62.57; 365/33; 428/692; 428/700; 428/702; 428/900

[58] Field of Search ..................... 252/62.57, ; 365/33; 428/900, 700, 692, 693, 702; 156/DIG. 63, 617 SP, 605, 606, 624

[56] References Cited

U.S. PATENT DOCUMENTS

| | | | |
|---|---|---|---|
| 3,654,162 | 4/1972 | Buhrer | 252/62.57 |
| 3,995,093 | 11/1976 | Heinz | 428/539 |
| 4,018,692 | 4/1977 | Akselrad | 252/62.57 |
| 4,169,189 | 9/1979 | Stacy et al. | 252/62.57 |

FOREIGN PATENT DOCUMENTS

| | | | |
|---|---|---|---|
| 51-18894 | 2/1976 | Japan | 252/62.57 |

OTHER PUBLICATIONS

Ito et al., LPE Films of Bismuth-Substituted Bubble Garnet, IEEE Transactions on Magnetics, vol. Mag. —9 No. 3, 9/73 pp. 460-463.

"Control of the Growth-Induced Magnetic Anisotropy in Ferrimagnetic Garnet Films Grown by Liquid-Phase Epitoxy," J. P. Krumme et al., Mat. Res. Bull, vol. 11, pp. 337-346 (1976).

"Properties and Device Applications of Magnetic Domainsin Orthoferrites," A. H. Bobeck, The Bell Sys. Tech. J., Oct. 1967, pp. 1901-1925.

*Primary Examiner*—Ellis P. Robinson
*Attorney, Agent, or Firm*—Marc D. Schechter

[57] ABSTRACT

A device for propagating magnetic domains, comprising a monocrystalline nonmagnetic substrate of a material having a garnet structure, and a layer of an iron garnet grown epitaxially on the nonmagnetic substrate. In the dodecahedral lattice sites, the iron garnet comprises at least a bismuth ion and a rare-earth ion selected from the group consisting of lutetium, thulium, and ytterbium. Such a magnetic garnet combines very high uniaxial anisotropy with a high domain mobility, which properties make the device extremely suitable for the propagation of magnetic domains having diameters from approximately 1 to approximately 2 μm under the influence of comparatively low driving fields.

7 Claims, 2 Drawing Figures

DEVICE FOR PROPAGATING MAGNETIC DOMAINS

BACKGROUND OF THE INVENTION

The invention relates to devices for propagating magnetic domains. Such devices each include a monocrystalline nonmagnetic substrate bearing a layer of an iron garnet. The iron garnet is capable of supporting local enclosed magnetic domains, and it has a uniaxial magnetic anisotropy induced substantially by growth on the nonmagnetic substrate. The iron-garnet is of the class of iron garnet materials in which at each dodecahedral site there is at least a large ion and a small ion.

In magnetic "bubble" domain devices, that the smaller the bubble diameter, the larger the information storage density which can be achieved. Iron garnet bubble domain materials are preferred for use in bubble domain technology because small diameter bubble domains are stable in these materials. For a bubble domain material to be useful for the manufacture of bubble domain devices, it is important that the bubbles formed in the material should have a high wall mobility so that comparatively small driving fields can cause rapid bubble movement. This property permits use of high frequencies with low energy dissipation.

It is also important that magnetic bubble domain materials should have a high uniaxial anisotropy. This is necessary to avoid spontaneous nucleation of bubbles. This is of great importance for reliable information storage and processing within the bubble domain material.

The overall uniaxial anisotropy ($K_u$) may have stress or strain induced components ($K_u^s$) and may have growth-induced components ($K_u^s$). This means that $$K_u \approx K_u^s + K_u^g \quad (1)$$

In the usual bubble domain materials, $K_u$ is mainly determined by the growth-induced component. In choosing ions to occupy dodecahedral sites in the lattice of a bubble garnet material (in order to increase the growth-induced anisotropy), in the past the choice was restricted to magnetic rare-earth ions. This was because the accepted theory for growth-induced anisotropy required the use of magnetic ions. However, the magnetic rare-earth ions used in the past provided additional damping, so that these choices did not lead to an optimum domain mobility. In fact the smaller the bubble domain becomes, the more damping ions have to be incorporated to reach the required high uniaxial anisotropy.

Netherlands Patent application No. 7514832 (see, also, U.S. Pat. No. 3,995,093) discloses a bubble domain device in which there is lanthanum and lutetium in the dodecahedral sites of the bubble domain material so as to produce the high bubble domain wall mobility which is desirable for operation at high frequencies. A film of this known material proves to have a growth-induced uniaxial anisotropy ($K_u^g$) of 6800 erg/cm$^3$, which is only sufficient to produce stable device behavior with a bubble domain cross-section not smaller than 4 $\mu$m.

The high growth-induced uniaxial anisotropy ($K_u^g$) of films of this known material is attributed to the combination of lanthanum (the largest of the rare-earth ions) with lutetium (the smallest of the rare-earth ions). The high bubble domain wall mobility is a result of the fact that neither lanthanum nor lutetium contribute to the damping except to a small extent. However, a disadvantage of this material is that only a small amount of lanthanum can be incorporated in the garnet lattice. Consequently, the anisotropy resulting from the combination of a large rare-earth ion and a small rare-earth ion at the dodecahedral lattice sites cannot be optimized.

SUMMARY OF THE INVENTION

It has unexpectedly been found that providing bismuth, a nonmagnetic ion not belonging to the class of the rare-earth ions, in combination with small rare-earth ions at dodecahedral sites, leads to a material having a comparable mobility to the known materials but with an approximately 10 times greater uniaxial anisotropy. Such a material is suitable for use in bubble domain devices having bubble domains with diameters as small as 0.8 $\mu$m.

The small rare-earth ions which may be used in combination with bismuth are lutetium, ytterbium and thulium.

Layers of iron garnet having a combination of bismuth ions and these small rare-earth ions in dodecahedral sites can be epitaxially grown on various substrates. Matching of the lattice constants is achieved by a suitable choice of the ratio of large ion to small ion occupant in the dodecahedral sites. Growth has generally been on $Gd_3Ga_5O_{12}$ (lattice constant $a_o = 12.38$ Å), but other materials which may be utilized are for example, $Eu_3Ga_5O_{12}$ ($a_o = 12.40$ Å) $Sm_3Ga_5O_{12}$ ($a_o = 12.43$ Å), and $Nd_3Ga_5O_{12}$ ($a_o = 12.50$ Å), or mixed crystals thereof. A face parallel to the crystallographic (111) face may serve as a deposition face.

In those cases in which the damping, which results from Bi ions occupying a portion of the dodecahedral sites, is smaller than is in fact necessary for the application in mind, one has the option of substituting, if desired, damping ions in part of the dodecahedral sites. If, for example, Sm or Eu is used for this purpose, the uniaxial anisotropy constant may be further increased (by approximately 15%).

A preferred material for maximizing the growth-induced anisotropy is $\{Bi, Y, M\}_3 Ga_y Fe_{5-y} O_{12}$, where M is Lu, one or more ion selected from the group of Lu, Tm and/or Yb. With a fixed Ga content, the anisotropy constant of a layer of the material reaches a maximum at a Lu:Y weight ratio, in the melt, of approximately 1:1. Iron garnet layers grown from this melt will have Lu:Y ratios of approximately 1:2. Elements other than gallium can be substituted for iron to reduce the magnetization of the resulting garnet layer, so a more general formula for this material is $\{Bi, Y, M\}_3 Q_y Fe_{5-y} O_{12}$, wherein Q is a nonmagnetic ion which preferably occupies tetrahedral lattice sites, $0 < y < 5$, and $(5-y)$ is sufficiently large to assure that the material is magnetic at the operating temperature. When the ion substitution at the iron sites has a charge of more than $+3$, a charge-compensating ion may be required at the dodecahedral sites, so that the material has the composition $\{Bi, Y, M\}_{3-z} J_z Q_y Fe_{5-y} O_{12}$, where J is a charge-compensating ion having a charge of $+1$ or $+2$ and which preferably occupies dodecahedral sites, Q is a nonmagnetic ion having a charge of more than $+3$, $0 < z < 3$, and $0 < y < 5$. In this case, again, the material must be magnetic at the temperature of operation of the device.

For growth on a rare earth-gallium garnet substrate, it is possible to choose a bubble domain layer according to the invention which provides a minimum mismatch ($<<1.6\times10^{-3}$ nm) between the lattice constant of the bubble domain layer and the lattice constant of the substrate. As a result of this small lattice mismatch, the stress or strain in the film is sufficiently small value to practically eliminate the possibility of cracking and tearing of the layer.

As appears from the formula which indicates the nominal composition of the present bubble domain materials, it is assumed that bismuth, yttrium, lutetium, thulium and ytterbium substitute exclusively at dodecahedral lattice sites. It has been found, however, that in the present material a small part of the small rare-earth ions substitutes in octahedral sites in the lattice. The octahedral substitution provides an improved temperature dependence for both the saturation magnetization and the collapse field.

The invention will be described in greater detail, by way of example, with reference to the following examples and the drawing.

DESCRIPTION OF THE PREFERRED EMBODIMENTS

Films of the nominal composition $(Bi_zY_xLu_{3-x-z})$ $Fe_{5-y}Ga_y)$ $O_{12}$ were grown from a melt by liquid phase epitaxy techniques while using a $PbO/Bi_2O_3$ flux. In this case x was varied from 0 to 1:2 and z was varied between 0.1 and 0.7. The variations were achieved by varying the $Y_2O_3/Lu_2O_3$ ratio in the melt or by growinglayers at different growth temperatures with a given $Y_2O_3/Lu_2O_3$ ratio in the melt. (The lower the temperature of the melt, the more Bi is incorporated in the layer.) In the above process it is always possible to find combinations of the $Y_2O_3/Lu_2O_3$ ratio in the melt and the growth temperature, $T_g$, which produce layers having lattice constants which differ by considerably less than $1.6\times10^{-3}$ nm from the lattice constants of the substrates on which the layers are grown. A difference in lattice constant of $1.6\times10^{-3}$ nm has been assumed as the limit within which layers of good quality can be grown without cracks or tears.

Figure 1:
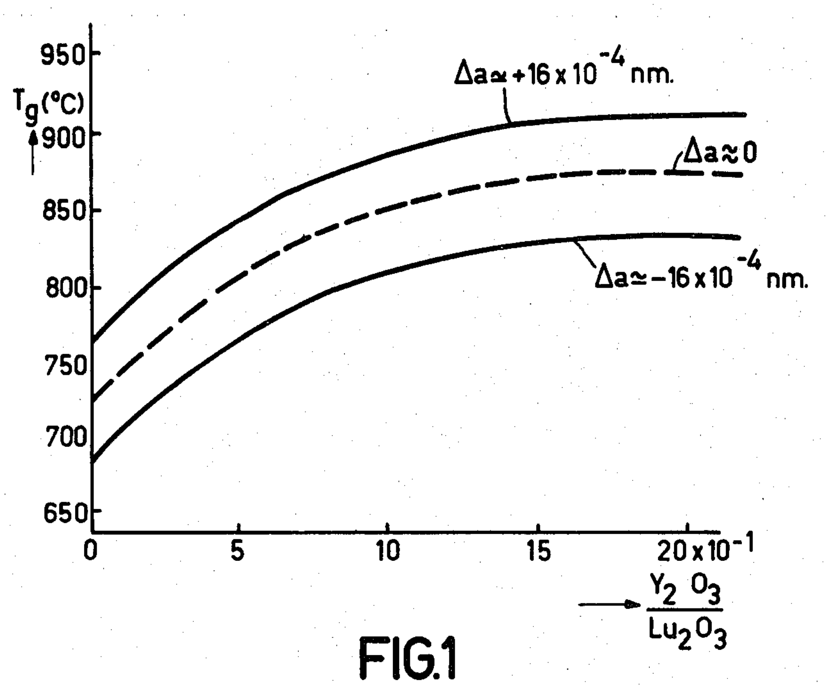
FIG. 1 is a graphic representation of the mismatch ($\Delta A$), between lattice bismuth-containing bubble domain layer according to the invention and a GGG-substrate, as a function of the weight ratio $Y_2O_3/Lu_2O_3$ in the melt and the growth temperature $T_g$.

FIG. 1 relates to the growth of magnetic garnet layers in $Gd_3Ga_5O_{12}$ substrates. The area between the solid lines indicates the conditions under which good layers were deposited on the relevant substrates without cracks or tears. The top line indicates the circumstances under which layers were formed with a misfit $\Delta a$, of approximately $+1.6\times10^{-3}$ nm (these layers were in tension), and the bottom line indicates the circumstances under which layers were formed with a misfit, $\Delta a$, of approximately $-1.6\times10^{-3}$ nm (these layers were in compression).

The layers were epitaxially grown on substrates immersed horizontally in the melt at temperatures between 680° and 970° C. for periods varying from 0.5–5 minutes. The substrates were rotated at 100 r.p.m. while in the melt, the direction of rotation being reversed after every 5 revolutions. The layer thicknesses varied from 0.5 to 4 μm.

EXAMPLE I

For growing of a layer having the nominal composition (Bi, Lu)$_3$ (Fe, Ga)$_5$O$_{12}$, the following oxides were weighed out in the following quantities:

$Bi_2O_3$: 133.47 g
PbO: 319.71 g
$Lu_2O_3$: 2.35 g
$Ga_2O_3$: 4.13 g
$Fe_2O_3$: 29.85 g

The mixture was melted and heated to a temperature of 723° C. A $Gd_3Ga_5O_{12}$ substrate having a (111) oriented deposition face was dipped in the melt, and a 2 μm thick layer was deposited on the substrate in 3 minutes.

EXAMPLE II

For growing a layer having the nominal composition (Bi, Y, Tm)$_3$ (Fe, Ga)$_5$ O$_{12}$, the following oxides were weighed out in the following quantities:

$Bi_2O_3$: 133.47 g
PbO: 319.71 g
$Y_2O_3$: 1.035 g
$Tm_2O_3$: 0.5 g
$Fe_2O_3$: 29.85 g
$Ga_2O_3$: 2.13 g

The mixture was melted and heated to a temperature of 855° C. A $Gd_3Ga_5O_{12}$ substrate having a (111) oriented deposition face was dipped in the melt, and a 1.16 μm thick layer was deposited on the substrate in 1 minute.

EXAMPLE III

For growing of a layer having the nominal composition (Bi, Y, Lu)$_3$ (Fe, Ga)$_5$O$_{12}$, the following oxides were weighed out in the following quantities:

$Bi_2O_3$: 133.47 g
PbO: 319.71 g
$Y_2O_3$: 1.035 g
$Ga_2O_3$: 2.13 g
$Fe_2O_3$: 29.85 g
$Lu_2O_3$: 1.5 g

The mixture was melted and heated to a temperature of 828° C. A $Gd_3Ga_5O_{12}$ substrate having a (111) oriented deposition face was dipped in the melt, and a layer having a thickness of 1.96 μm was deposited on the substrate in 1 minute.

EXAMPLE IV

For growing of a layer having the nominal composition (Bi, Y, Lu)$_3$ (Fe, Ga)$_5$O$_{12}$, the following oxides were weighed out in the following quantities:

$Bi_2O_3$: 133.47 g
PbO: 319.71 g
$Y_2O_3$: 1.035 g
$Lu_2O_3$: 2.00 g
$Fe_2O_3$: 29.85 g
$Ga_2O_3$: 4.13 g

The mixture was melted and heated to a temperature of 810° C. A $Gd_3Ga_5O_{12}$ substrate having a (111) oriented deposition face was dipped in the melt, and a layer having a thickness of 2,38 μm was deposited on the substrate in 45 seconds.

EXAMPLE V

For growing of a layer having the nominal composition {Bi, Y, Lu}$_3$ (Fe, Ga)$_5$O$_{12}$, the following oxides were weighed out in the following quantities:

$Bi_2O_3$: 133.47 g
PbO: 319.71 g
$Y_2O_3$: 1.635 g
$Lu_2O_3$: 1.200 g
$Fe_2O_3$: 29.85 g
$Ga_2O_3$: 4.5 g

The mixture was melted and heated to a temperature of 766° C. An $Sm_3Ga_5O_{12}$ substrate (lattice constant $a_o$=12.432 Å) having a (111) oriented deposition face was dipped in the melt for 1½ minutes producing a layer having a thickness of 3.80 μm.

The layers grown as described above had the properties shown in the Table, below.

TABLE

| Layer No. | I | II | III | IV | V |
|---|---|---|---|---|---|
| Δ a (Å) | <0.001 | −0.007 | <0.001 | −0.002 | <0.001 |
| B(μm) | 1.6 | 1 | 0.83 | 2.25 | 2.63 |
| $K_u$(erg.cm$^{-3}$) | 3.5 × $10^4$ | 4.36 × $10^4$ | 5.2 × $10^4$ | 5.4 × $10^4$ | 7.9 × $10^4$ |
| Δ H (Oe) | 8 | 16 | 3 | 3 | 8 |
| $4\pi M_s$ (Gauss) | 428 | 821 | 791 | 471 | 427 |
| μ(m sec$^{-1}$Oe$^{-1}$) | | | | 345 | |

In the Table, B is the stable strip domain width, $K_u$ is the uniaxial anisotropy constant, ΔH is the ferromagnetic resonance line width at 10 GHz, $4\pi M_s$ is the saturation magnetization, and μ is the bubble domain mobility.

The uniaxial anisotropy constants of the resulting layers were determined by means of a torsion magnetometer. Values up to 5.4×$10^4$ erg/cm$^3$ were thus realized for (Bi, Y, Lu)$_3$ (Fe, Ga)$_5$O$_{12}$ films on GGG. These values can be approximately 1.5 times larger for the same films on SGG.

According to the invention a new type of bubble domain material has been provided with properties which make it exceptionally suitable for use in bubble domain propagation devices with 1 to 2 μm bubble domains. Those skilled in the present technology will be capable of varying the composition of the bubble domain layer within the general composition (Bi, Y, M)$_{3-z}$J$_z$ Q$_y$ Fe$_{5-y}$O$_{12}$, without departing from the scope of the present invention. Consequently, the Examples have been given only by way of illustration and not by way of limitation.

Figure 2:
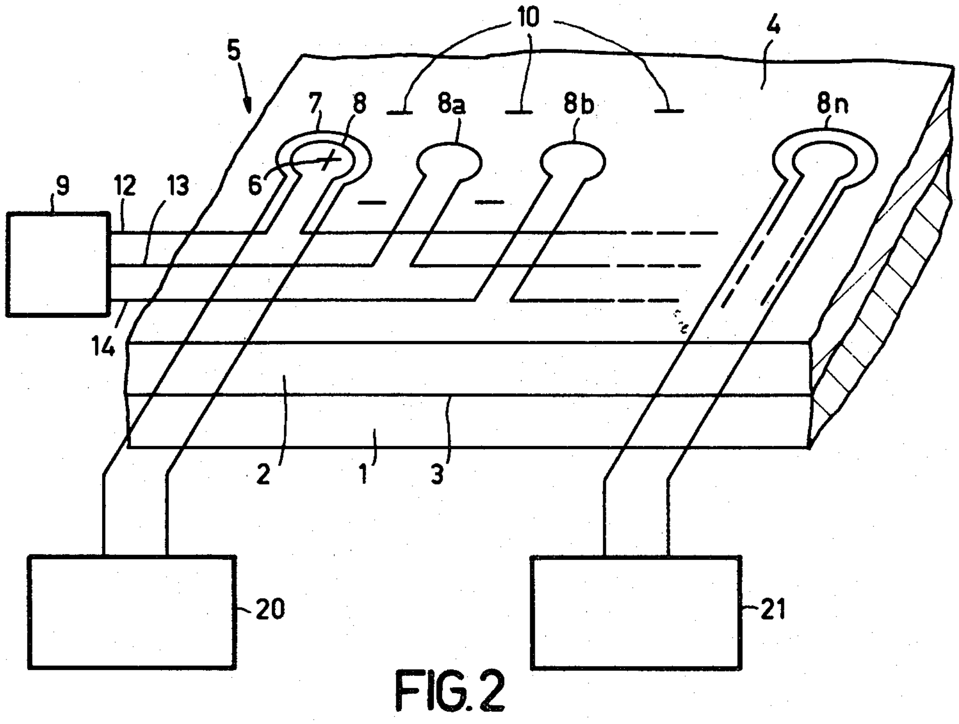
FIG. 2 shows, partly schematically and partly in cross-section, a bubble domain device.

Referring to FIG. 2, in one embodiment according to the invention a substrate 1 and a bubble domain layer (for the active storage and movement of magnetic domains) have a common interface 3. The lattice mismatch is as described above. The layer 2 has an upper surface 4 remote from the interface 3. The surface 4 bears certain conventional elements for the excitation propagation, and sensing of domains. The layer 2, generally speaking, may provide various digital logic functions, as described in patents and other technical literature, (for example, see, The Bell System Technical Journal, XLVI, No. 8, 1901-1925 (1967) in which there is an article entitled "Properties and Device Applications of Magnetic Domains in Orthoferrites").

Referring again to FIG. 2, there is a rather simple configuration, which represents only a fragment of a normally larger device comprising a layer 2, for storage and movement of magnetic domains, and various conventional elements for the excitation, movement, and sensing of magnetic domains. FIG. 2 may be considered to represent a shift register 5 in which, according to the invention, a layer 2 of a magnetic material having a high uniaxial magnetic anisotropy and high domain mobility is used. The easy axis of magnetization of the layer 2 is perpendicular to the surface 4. The background magnetization of the layer 2 (denoted by minus signs 10) is characterized by lines of magnetic flux directed perpendicular to the surface 4. Magnetic flux lines situated inside the domains are directed opposite to the background magnetization and are indicated by plus signs, for example the plus sign 6 within conductor loop 7.

Conductors 12, 13 and 14, which receive electric currents from a domain transmitter 9, can be connected to or can be present in the immediate proximity of the surface 4 of the layer 2. The conductors 12, 13 and 14 are coupled respectively to successive triads of conductive loops, for example, the loops 8, 8*a*, and 8*b* of a first of such a triad. An array of rows and columns of such multiple loop arrangements is often used in storage systems. A magnetic bias field for stabilizing domains is provided in a conventional manner, for example, by using of a coil or coils (not shown) surrounding the substrate-bubble domain layer configuration, or by the use of permanent magnets.

During operation of the device the magnetic domains are excited by means of a conventional domain generator 20 combined with a loop 7 which is substantially coaxial with a loop 8. A stable, cylindricaldomain, for example the domain indicated by the plus sign 6, can be propagated in incremental steps from the location of the loop 8 to the location of the loop 8*a*, then to that of loop 8*b*, etc., by successive excitation of the conductors 12, 13 and 14 etc. by the domain propagator 9. When a propagated magnetic domain reaches loop 8*n*, it can be detected by means of domain sensor 21. It will be obvious that other digital logic functions can easily be carried out while using the same known methods as those which are used in the example of the shift register 5.

Bubble domain layers according to the invention were also deposited from one melt, in a thickness of approximately 1 μm, on a GGG substrate (lattice constant $a_o$=12.38 Å), a SGG substrate ($a_o$=12.43 Å) and a NGG substrate ($a_o$=12.50 Å). By varying the growth temperatures (these were 832° C., 742° C. and 699° C., respectively) it was ensured that the lattice parameter of each layer was adapted as much as possible to the lattice parameter of the substrate on which it was deposited. The melt contained 0.9 g of $Y_2O_3$, 1.0 g of $Lu_2O_3$ and 2 g of $Ga_2O_3$ and further had the same composition as that of example V. This experiment demonstrates that, by means of the invention, bubble domain layers with very high uniaxial anisotropy constants (these were 6×$10^4$ erg.cm$^{-3}$; 9.12×$10^4$ erg.cm$^{-3}$ and 1.4×$10^5$ erg.cm$^{-3}$, resepctively) in combination with high wall mobilities and low line widths (4 Oe, 4 Oe and 1 Oe, respectively) are characteristic, are possible.

What is claimed is:

1. A device for propagating magnetic domains comprising:

a monocrystalline, nonmagnwetic substrate having a surface; and a monocrystalline layer of an iron garnet epitaxially provided on the surface of the substrate, said layer having a uniaxial magnetic anisotropy induced substantially by growth;

characterized in that at the dodecahedral lattice sites, the iron garnet consists essentially of bismuth and at least one rare-earth ion, selected from the group consisting of lutetium, thulium, and ytterbium, in amounts which will produce a uniaxial magnetic anisotropy sufficiently high to enable the iron garnet layer to support magnetic domains having diameters of two microns or less.

2. A device as claimed in claim 1, characterized in that the nonmagnetic substrate has a lattice parameter of $a_o$, the iron garnet has a lattice parameter of $a_1$, and $-1.6\times10^{-3}nm<a_0-a_1<1.6\times10^{-3}nm$.

3. A device as claimed in claim 2, characterized in that at the dodecahedral lattice sites the iron garnet further includes yttrium.

4. A device as claimed in claim 3, characterized in that the iron garnet further includes one or more ions from the group consisting of germanium, silicon, aluminum, and gallium, preferably at tetrahedral lattice sites.

5. A device as claimed in claim 4, characterized in that at dodecahedral lattice sites the iron garnet further includes samarium and/or europium.

6. A device as claimed in claim 3, 4, or 5, characterized in that the weight ratio of yttrium to the group consisting of lutetium, thulium, and ytterbium is from 0:1 to 2.5:1.

7. A device as claimed in claim 6, characterized in that:

the nonmagnetic substrate has the formula $RE_3Ga_5O_{12}$, where RE is at least one element selected from the group consisting of gadolinium, europium, samarium, and neodymium; and the lattice parameter $a_o$ is between 1.238 and 1.250 nm.

* * * * *